United States Patent
Carpi

(10) Patent No.: US 6,767,674 B2
(45) Date of Patent: Jul. 27, 2004

(54) METHOD FOR OBTAINING ELLIPTICAL AND ROUNDED SHAPES USING BEAM SHAPING

(75) Inventor: Enio Luiz Carpi, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 264 days.

(21) Appl. No.: 10/032,389

(22) Filed: Oct. 26, 2001

(65) Prior Publication Data

US 2003/0082461 A1 May 1, 2003

(51) Int. Cl.[7] .............................. G03F 9/00; G03F 7/00
(52) U.S. Cl. ........................ 430/5; 430/296; 430/311; 430/313; 430/394; 430/396; 430/942; 430/945
(58) Field of Search ............................. 430/5, 296, 311, 430/313, 396, 942, 945, 394

(56) References Cited

U.S. PATENT DOCUMENTS

| | | | |
|---|---|---|---|
| 4,692,583 A | * 9/1987 | Kimura et al. | 219/121 |
| 4,907,021 A | * 3/1990 | Yabu | 353/101 |
| 5,258,623 A | 11/1993 | Kawai | 250/561 |
| 5,525,840 A | 6/1996 | Tominaga | 257/797 |
| 5,830,605 A | * 11/1998 | Umeki et al. | 430/5 |
| 5,847,959 A | 12/1998 | Veneklasen et al. | 364/468.28 |
| 5,989,759 A | 11/1999 | Ando et al. | 430/22 |
| 6,040,114 A | 3/2000 | Inoue et al. | 430/296 |
| 6,121,942 A | 9/2000 | Sanou et al. | 345/75 |
| 6,214,496 B1 | * 4/2001 | Carpio et al. | 430/5 |

FOREIGN PATENT DOCUMENTS

| JP | 2000-066366 | * 3/2000 | G03F/1/08 |
|---|---|---|---|
| JP | 2001-236694 | * 8/2001 | G11B/7/26 |
| WO | WO 00/75954 A2 | 12/2000 | |

* cited by examiner

*Primary Examiner*—Nicole Barreca
(74) *Attorney, Agent, or Firm*—Slater & Matsil, L.L.P.

(57) ABSTRACT

A method of fabricating a mask (316) for patterning a semiconductor wafer. The mask (316) includes elliptical (340) or rounded features formed using an elliptical-shaped energy beam (350). Undesired stair-step shaped edges (344) of the oval (340) or rounded features formed by using a substantially circular-shaped energy beam to form the oval or rounded features are smoothed with the elliptical-shaped energy beam (350). A method of fabricating a semiconductor device with the mask (316) is included. The elliptical-shaped energy beam (350) may also be used to directly pattern a semiconductor wafer.

22 Claims, 2 Drawing Sheets

METHOD FOR OBTAINING ELLIPTICAL AND ROUNDED SHAPES USING BEAM SHAPING

TECHNICAL FIELD

This invention relates to semiconductor fabrication tools, and more particularly, to a method for generating Ag patterns on photomasks or reticles used in the fabrication of semiconductor devices.

BACKGROUND

Semiconductor devices are used in a variety of electronic applications, such as personal computers and cellular phones, for example. Semiconductor fabrication processes typically utilize photolithographic processing to pattern areas of a surface of a semiconductor wafer. Photolithography typically includes applying a photoresist material to the surface of a semiconductor device, and then patterning the photoresist by exposing the photoresist to light, typically ultraviolet light, to cross-link the resist material, e.g., in a negative resist process. Cross-linking prevents a reaction with a developer which develops away areas of the photoresist which were not cross-linked by exposure to the UV light. Other types of photoresists have chains broken by exposure, e.g., in a positive resist process, to ultraviolet light.

Photoresist layers on a semiconductor device are typically patterned using a photomask or reticle, referred to herein as a "mask". A mask functions as a shield to prevent light from passing through it in predetermined areas during photolithography. A mask typically comprises an opaque, or highly absorbent layer of material, usually a metal such as chromium or a chromium alloy, patterned in accordance with the patterning design to be projected onto the semiconductor wafer. The opaque or semi-opaque regions are formed on a transparent substrate usually quartz. The masks are used which may include and electron beam masks, and scattering masks and/or stencil masks, for example, scattering with angular limitation in projection electron beam lithography (SCALPEL).

The semiconductor industry in general is being driven to decrease the size of semiconductor devices. Miniaturization is generally needed to accommodate the increasing density of circuits necessary for today's semiconductor products. With the trend towards decreasing feature sizes of semiconductor components, lithography masks are increasingly becoming more difficult to fabricate and inspect. Advanced semiconductor processing is very sensitive to the image quality provided by masks. The defect fabrication capability for masks is limited to a certain minimum feature size, which typically depends on the process and fabrication tools used to provide the pattern on the mask.

Masks may be patterned, or written, by sources such as laser pattern generators or electron beam pattern generators. Because masks typically include a multitude of features having dimensions below a micron in size, fabrication is typically performed using automated devices.

Referring to FIG. 1, a prior art lithography mask fabrication system 100 is shown that includes a stage 114 for positioning a mask or reticle 116 to be fabricated. An energy source 110 provides an energy beam such as a laser beam or electron beam adapted to write a pattern on mask 116 with a predetermined intensity of light or electrons. The mask 116 is preferably guided by a positioner or stage 114 according to a computer-generated image of the pattern to be written on the mask 116.

A blank mask 116 is provided having no pattern exists thereon. The mask 116 includes a light-absorbing opaque material, such as, chromium, molybdenum or their alloys, or metal oxides disposed on a transparent glass or quartz substrate. The mask 116 is mounted to a stage or positioner 114 or other positioning device. The stage 114 is capable of accurately positioning the mask 116, including rotations. A lens system 112 is disposed between the mask 116 and source 110, adapted to focus an energy beam generated by energy source 110. The energy source 110 preferably generates an energy beam, such as light in ultraviolet wavelengths or an electron beam with electrons having energies of about 50 keV or less, as examples. Energy source 110 may comprise, for example, an excimer laser. Lens system 112 controls the size and shape of a beam used to write a pattern on the mask 116.

During fabrication, source 110 generates an energy beam that is focused and shaped by lens system 112 that is adapted to direct the beam onto mask 116. Mask 116 is manipulated by translating and rotating stage 116 according to a pattern that may be stored in a memory 125 of a computer 120, for example. The processor 123 of the computer 120 sends signals to control the stage's 114 motion to write the pattern stored in memory 125 on a resist layer. Source 110 may be controlled by processor 123. Processor 123 may be adapted to send signals to source 110 to turn the beam on and off in accordance with the pattern. Alternately, a shutter (not shown) may be used to halt the propagation of the beam.

Both laser and electron beam pattern generators have the capability of producing complex mask patterns, including those with narrow geometries, dense optical proximity correction (OPC) and phase shift masks (PSM). OPC helps compensate for lost light to ensure that the precise patterns are formed on a semiconductor wafer. For example, without OPC, a rectangle produce a pattern on a semiconductor wafer that appears oval because light tends to round on the edges. OPC is used to correct this phenomenon by adding tiny serifs, or lines, to the corners to ensure that the corners are not rounded, or moving a feature edge so wafer features are sized more accurately. Phase shift masks alter the phase of light passing through the photomask, and permit improved depth of focus and resolution on the wafer. Phase shifting helps reduce the distortion of line resolution of wafer surface irregularities.

SUMMARY OF THE INVENTION

Embodiments of the present invention achieve technical advantages as a method of fabricating lithography masks using an elliptical laser/electron beam to smooth rough edges of mask features and create elliptical and rounded features with smooth, curved edges.

In one embodiment, disclosed is a method of fabricating a mask for patterning a semiconductor wafer, comprising providing a mask blank including a substrate and an opaque material formed thereon, and patterning the opaque material with oval or rounded features using an elliptical-shaped energy beam.

In another embodiment, disclosed is a method of fabricating a mask for patterning a semiconductor device, comprising providing a substrate including an opaque material formed thereon, and forming a pattern on the opaque material, portions of the pattern having stair-step shaped edges. The stair-step shaped edges formed on the opaque material are reduced using an elliptical-shaped energy beam.

Also disclosed is a method of fabricating a mask for patterning a semiconductor device, comprising providing a substrate including a transparent material, depositing an opaque material over the substrate, and using a substantially circular-shaped energy beam to form a pattern including oval or rounded features on the opaque material, portions of the oval or rounded features including undesired stair-step shaped edges. The oval or rounded feature stair-step shaped edges are at least partially removing using an elliptical-shaped energy beam.

Further disclosed is a method of fabricating a semiconductor device, comprising providing a semiconductor wafer, and patterning the semiconductor wafer with a mask, the mask including oval or rounded features formed using an elliptical-shaped energy beam.

Also disclosed is a method of patterning a semiconductor wafer, comprising providing a semiconductor wafer having a surface and depositing a resist over the semiconductor wafer surface. The method includes patterning the resist with an energy beam, wherein the energy beam comprises a beam having an elliptical-shaped cross-section. The resist is used to pattern the wafer surface.

Advantages of embodiments of the invention include providing a method of creating oval and rounded features on a semiconductor device mask that are absent the stair-step edges resulting from laser/electron beam patterning using a beam having a circular cross-section. Memory semiconductor devices such as magnetic random access memory (MRAM) devices and dynamic random access memory (DRAM) devices particularly benefit from the ability to create elliptical shapes and patterns, maximizing memory cell performance. Furthermore, smoothing the edges of oval and rounded features with an elliptical-shaped laser/electron beam is faster, requires a lower power density, and patterns a larger surface area than using a circular cross-sectional energy beam, as in prior art processes. Prior art laser and electron beam sources may be used, by adjusting energy sources in accordance with embodiments of the present invention to create an elliptical cross-sectional beam.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art mask patterning will be discussed, followed by a description of preferred embodiments of the present invention and a discussion of some advantages thereof.

Figure 1:
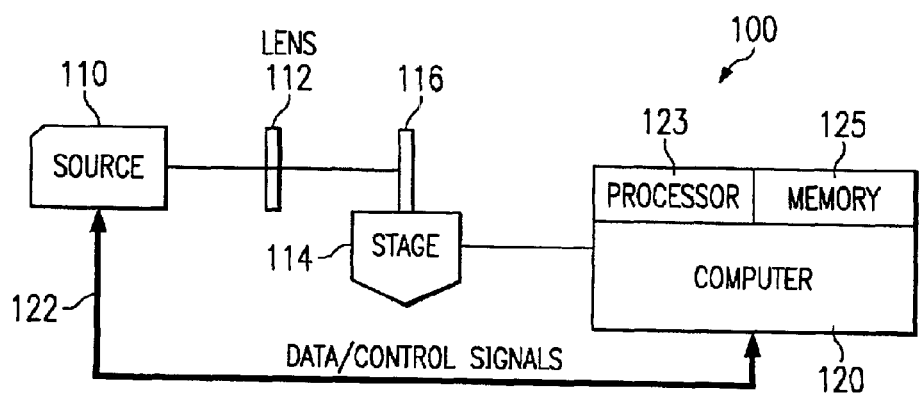
FIG. 1 is a block diagram of a conventional laser/electron pattern generator for patterning masks for semiconductor fabrication processes.
Figure 2:
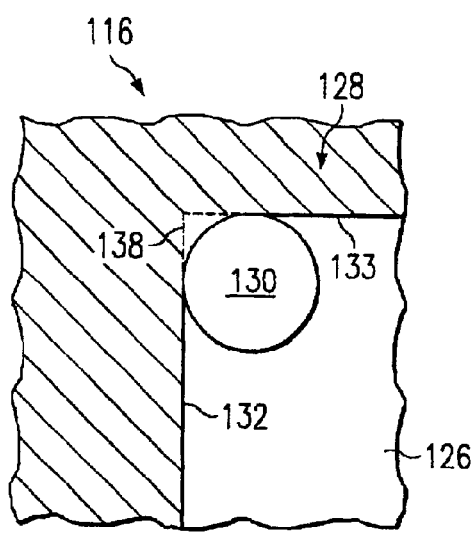
FIG. 2 illustrates a cross-sectional view of a laser/electron beam having a circular cross-section used to pattern a mask in a prior art process.

Although laser/electron beam pattern generator systems such as the one shown in FIG. 1 provide higher mask throughput, lower cost and better placement accuracy than other methods available, some problems with the technology exist. For example, corner rounding is a problem, as described in U.S. Pat. No. 6,214,496 issued on Apr. 10, 2001, incorporated herein by reference. FIG. 2 shows a prior art mask 116 exhibiting corner rounding. The mask 116 includes a transparent substrate 126 and an opaque material 128 comprising a metal such as chrome, for example. A resist is deposited over material 128, and a laser/electron beam 130 having a substantially circular cross-section is used to pattern the resist. The beam cross-links or breaks the polymer chain on desired regions which are subsequently removed by applying adequate solvents. Because the beam 130 cross-section is circular, the corners 138 of the mask 116 pattern are rounded, rather than coming to a point in the corner at a right angle, as desired. U.S. Pat. No. 6,214,496 discloses using the short axis of an elliptical laser/electron beam to reduce corner rounding.

Figure 3A:
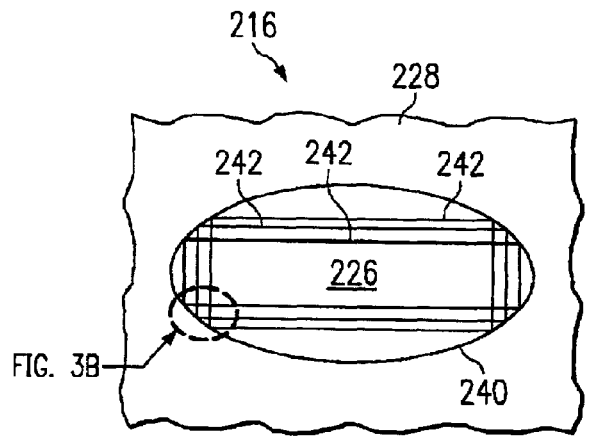
FIG. 3 shows a prior art mask having an oval feature formed by a plurality of superimposed rectangular patterns using prior art laser/electron beam mask patterning.
Figure 3B:
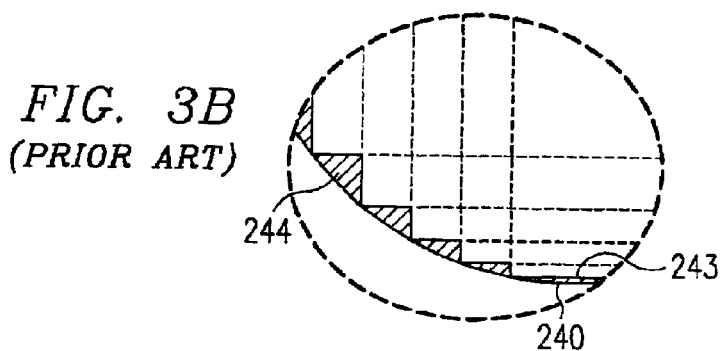

Another problem with using a laser beam or an electron beam to write a pattern on mask is that creating oval, rounded or curved shapes with a laser/electron beam having a substantially circular cross-section proves challenging. FIG. 3A shows a prior art mask having a substrate 226 and opaque material 228 disposed thereon. Oval features 240 and other rounded features (not shown) are patterned on opaque material 228 by superimposing a plurality of different sizes of rectangular and square patterns 242 having corners with substantially right-angles. Each rectangular pattern 242 is formed by passing an energy beam having a substantially circular cross-section across the mask 216. As shown in enlarged view of FIG. 3B superimposing an array or plurality of rectangular patterns 242 results in an edge 243 having a stair-step shape and undesired material 244 on the mask 216.

It is desirable in the art to produce masks 216 not having excess material 244 and stair-step shaped edges 243. The ability to produce elliptical and rounded features with smooth edges is needed. Certain semiconductor devices such as MRAMs and DRAMs would particularly benefit from the formation of elliptical or oval shapes on a mask, with improved memory cell performance, for example, if the mask oval shapes are used to form trenches and other features for memory cells, for example.

Furthermore, grid snapping and limitations on exposure tools can affect turn-around time (TAT) and overall mask quality and pattern fidelity.

What is needed in the art is a method of manufacturing a mask for patterning a semiconductor wafer having elliptical and rounded features that are absent undesired stair-step shape patterns along the edges.

Figure 4:
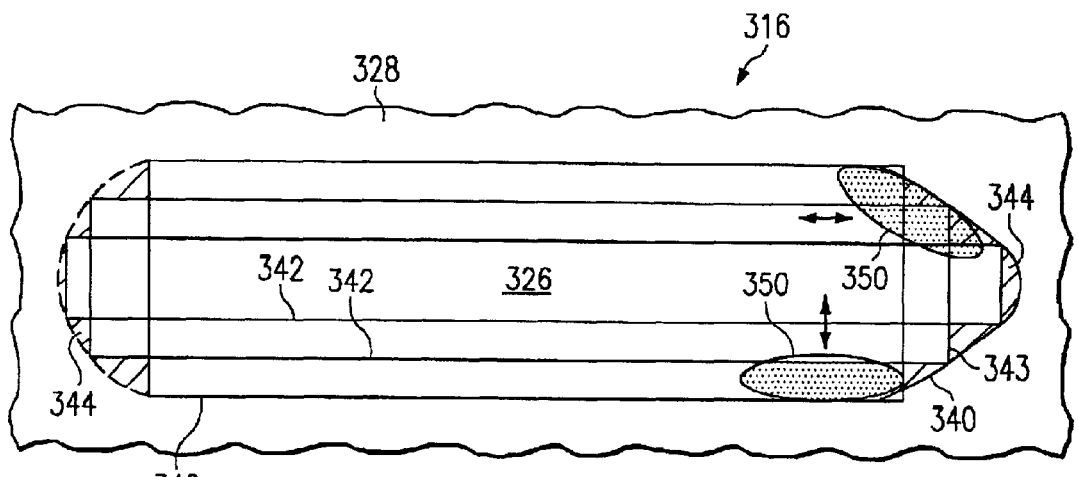
FIG. 4 shows an elliptical laser/electron beam being used to smooth the curves of an oval feature of a mask in accordance with an embodiment of the present invention.

FIG. 4 shows an elliptical-shaped laser/electron beam 350 being used to smooth the curves of an oval feature 340 of a mask 316 in accordance with an embodiment of the present invention. A mask blank 316 is provided having a transparent substrate 326 and an opaque material disposed thereon. A resist 328 may be deposited or formed on the mask blank 316. A plurality of rectangular shapes 342 are patterned, for example, using a circular cross-section energy beam, on the mask 316. The array of rectangular shapes 342 at the exterior edge 343 form a stair-step shaped pattern that outlines the oval desired. Excess material 344 resides on the mask resist 328 after forming the array of rectangular shapes 342.

In accordance with a preferred embodiment of the invention, an elliptical laser beam 350 is used to remove the excess material 344 in order to achieve the desired oval shape 340 on the mask 316. Preferably, the laser positioning and cross-sectional shapes are programmed into the memory of the computer controlling the patterning, for example.

Referring to FIG. 4, a closer view of the rectangular shapes 342 may be seen. A rectangular shape 342 stair-shaped edge 343 comprises a first side 133 and a second side 132, the first and second sides 133/132 being positioned at substantially right angles to one another to form a substantially right-angle corner. Reducing the stair-step shaped edges in accordance with embodiments of the present invention comprises smoothing the right-angle corners of the stair-shaped edge 343 and removing excess material 344.

Figure 5:
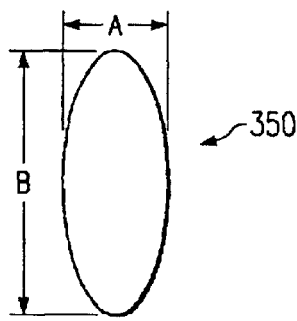
FIG. 5 is a cross-sectional view of a beam having an elliptical cross-section that is used for smoothing elliptical and rounded features of a mask pattern in accordance with an embodiment of the present invention.

FIG. 5 shows a cross-sectional view of a beam 350 having an elliptical cross-section that is used for smoothing elliptical and rounded features of a mask 316 pattern in accordance with an embodiment of the present invention. Energy beam 350 comprises a long axis B and a short axis A. Axis B may be twice as long as axis A, for example, and alternatively, axis B may be between ½ to 3 times longer than axis A, for example. Preferably, in accordance with an embodiment of the invention, an edge along the long axis B of the beam 350 is used to remove excess material 344 to form the desired oval or elliptical shape 340 on the mask 316, as shown in FIG. 4. Alternatively, the short axis may also be used, for example, and in another embodiment, the elliptical beam 350 may be placed at an angle, using a portion of both the long axis B beam edge and a portion of the short axis A beam edge to shape and smooth rounded features on the mask 316.

Figure 6:
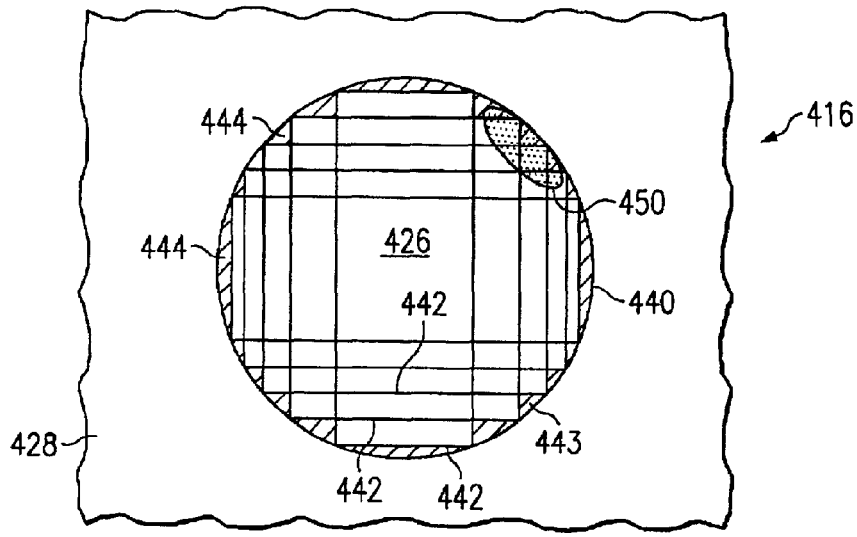
FIG. 6 shows an elliptical laser/electron beam being used to smooth the curves of a rounded feature of a mask in accordance with an embodiment of the present invention.

FIG. 6 shows an elliptical laser/electron beam 450 being used to smooth the curves of a circular feature 440 of a mask in accordance with an embodiment of the present invention. Preferably, an edge along the long axis B of beam 450 is used to smooth the edges of the circular shape 440, removing excess material 444 from the annular exterior region of the stair-shaped edge 443 of the superimposed rectangular pattern array 442.

In another embodiment, the elliptical laser/electron beam 350/450 described herein may be used to pattern shapes on a mask 316/416, without the use of an array of superimposed rectangular shapes 342/442 formed first by an energy beam having a substantially rounded shape, for example. Because the elliptical beam 350/450 is larger than a circular beam used the prior art, less time is required to pattern a mask 316/416, and a higher throughput of masks 316/416 is achieved.

In accordance with embodiments of the invention, the elliptical cross-section energy beam 350/450 is preferably used to pattern features on a mask 316/416 having rounded edges, such as ovals, ellipses, circles, S-shapes, and other rounded shapes, as examples.

Figure 7:
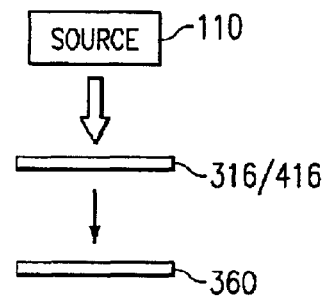
FIG. 7 illustrates a mask manufactured in accordance with an embodiment of the present invention being used to pattern a semiconductor wafer.

FIG. 7 illustrates a mask 316/416 manufactured in accordance with an embodiment of the present invention being used to pattern a semiconductor wafer 360. Mask 316/416 manufactured in accordance with the method described herein is disposed between a light or energy source 110 and a semiconductor wafer 360 to be patterned. Semiconductor wafer 360 may comprise a substrate, with a plurality of conductive and insulative layers disposed thereon that require patterning, for example. A resist may be applied prior to patterning each layer; for example, a different mask 316/416 is typically used to pattern each layer.

Light or other energy is emitted from source 110, exposing the wafer 360 in transparent regions 326/426 of the mask 316/416. Advantageously, by the use of the mask 316/416 fabricated as described herein, oval and rounded features may be patterned more precisely on the wafer 360. Smaller feature sizes may be achieved on the wafer 360, and improved focus is achieved.

An alternative method of generating patterns on a semiconductor wafer is called "direct write", in which the patterns are directly formed on the wafer using a laser or electron-beam, for example. This technique does not require a photomask, and is often used for fast prototyping or small volume applications, for example.

Embodiments of the present invention include using an elliptical-shaped energy beam to directly pattern a semiconductor wafer in a direct write method. A beam such as the beam 350 shown in FIG. 5 having an elliptical-shaped cross-section may be used to directly form elliptical and rounded features on a semiconductor wafer in accordance with an embodiment of the present invention.

One embodiment of the invention comprises a method of patterning a semiconductor wafer, including providing a semiconductor wafer having a surface, depositing a resist over the semiconductor wafer surface, and patterning the resist with an energy beam, wherein the energy beam comprises a beam having an elliptical-shaped cross-section. The energy beam 350 may comprise a laser, ion beam, or electron energy beam, as examples. Oval or rounded features are patterned on the resist using the beam. The resist is then used to pattern the wafer surface.

In another embodiment, a substantially circular-shaped energy beam is used to form a pattern including the oval or rounded features on the resist, with portions of the oval or rounded features including undesired stair-step shaped edges. The oval or rounded feature stair-step shaped edges are at least partially removed with the elliptical-shaped energy beam 350.

Another embodiment includes a semiconductor device patterned using the direct patterning methods described above.

Embodiments of the present invention provide several advantages over prior art methods of fabricating semiconductor device masks. A method of creating oval and rounded features on a semiconductor device mask is provided, such that the oval and rounded features are absent the stair-step edges resulting from laser/electron beam patterning using a beam having a circular cross-sectional. MRAM and DRAM devices particularly benefit from the ability to create elliptical shapes and patterns for memory cells, maximizing memory cell performance. Furthermore, smoothing the feature edges with an elliptical-shaped laser/electron beam is faster, requires a lower power density, and patterns a larger surface area than using a circular cross-sectional energy beam. Prior art laser and electron beam sources may be used, by adjusting prior art sources in accordance with embodiments of the present invention to create an elliptical cross-sectional beam.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a mask for patterning a semiconductor wafer with at least one feature having rounded edges, comprising the steps of:

providing a mask blank suitable for patterning, said mask blank comprising a substrate and an opaque material formed thereon;

patterning the opaque material with oval or rounded features;

projecting an energy ream having an elliptical cross-sectional shape onto said mask blank, said elliptical cross-sectional shape defining a long axis and a short axis;

positioning said long axis of said energy beam at a first angular position with respect to said mask blank and providing relative movement between said mask blank and said energy beam to form a first portion of said at least one feature; and positioning said long axis of said energy beam on said mask blank to a second angular position and providing relative motion movement between said mask blank and said energy beam to form a second portion of said at least one feature.

2. The method according to claim 1, wherein an edge along the energy beam long axis is used to pattern oval features on said mask blank.

3. The method according to claim 1, further comprising using the mask to fabricate a semiconductor device.

4. The method of claim 1, wherein said energy beam remains stationary and said mask blank moves.

5. The method of claim 1, wherein said mask blank remains stationary and said energy beam moves.

6. A method of fabricating a mask for patterning a semiconductor device with at least one feature having rounded edges, comprising the steps of:

providing a substrate including an opaque material formed thereon;

projecting an energy beam onto said substrate to form a pattern on the opaque material, portions of the pattern having stair-step shaped edges; and projecting and positioning an elliptical-shaped energy beam onto said substrate at two or more different angular positions mask to reduce the stair-step shaped edges formed on the opaque material.

7. The method according to claim 6, wherein said step of projecting said energy beam to form a pattern comprises forming a pattern having at least one edge having two sides being positioned at substantially right angles to one another to form a substantially right-angle corner, and wherein reducing the stair-step shaped edges comprises smoothing the right-angle corners.

8. The method according to claim 7, wherein said step of projecting an energy beam to form said pattern comprises using a circular-shaped energy beam.

9. The method according to claim 6, wherein the elliptical-shaped energy beam includes a long axis and a short axis, wherein an edge along the energy beam long axis is used to remove the stair-step shaped edges.

10. The method according to claim 6, wherein said step of projecting an enemy beam to form a pattern comprises forming oval or rounded features.

11. The method according to claim 6, wherein reducing the stair-step shaped edges comprises using a laser or electron energy beam.

12. The method according to claim 6, further comprising using the mask to pattern a semiconductor wafer.

13. The method according to claim 12, wherein the semiconductor wafer patterned comprises a magnetic random access memory (MRAM) or dynamic random access memory (DRAM) device.

14. A method of fabricating a mask for patterning a semiconductor device with at least one feature having rounded edges, comprising the steps of:

providing a substrate made of a transparent material;

depositing an opaque material over the substrate;

using a substantially circular-shaped energy beam to form a pattern including oval or rounded features on the opaque material, portions of the oval or rounded features including undesired stair-step shaped edges; and at least partially removing the oval or rounded feature stair-step shaped edges by projecting and angularly positioning an elliptical-shaped energy beam onto said substrate at two or more different angular positions.

15. The method according to claim 14, wherein the oval or rounded features stair-step shaped edges include as least one edge having two sides being positioned at substantially right angles to one another to form a substantially right-angle corner, wherein removing the stair-step shaped edges comprises removing the right-angle corners.

16. The method according to claim 15, wherein the elliptical-shaped energy beam includes a long axis and a short axis, wherein an edge along the energy beam long axis is used to remove the stair-step shaped edges.

17. The method according to claim 16, wherein removing the oval or rounded feature stair-step shaped using a laser or electron energy beam.

18. The method according to claim 14, further comprising using the mask to fabricate a semiconductor device.

19. The method according to claim 18, wherein the semiconductor device fabricated comprises a magnetic random access memory (MRAM) or dynamic random access memory (DRAM) device.

20. A method of fabricating a semiconductor device with at least one feature having rounded edges, comprising the steps of:

providing a semiconductor wafer;

providing a mask blank suitable for patterning said mask blank comprising a substrate and an opaque material formed thereon;

patterning the opaque material with oval or rounded features using an elliptical-shaped energy beam;

projecting an energy beam having an elliptical cross-sectional shape onto said mask blank, said elliptical cross-sectional shape defining a long axis and a short axis;

positioning said long axis of said energy beam at a first angular position with respect to said mask blank and providing relative movement between said mask blank and said energy beam to form a first portion of said at least one feature;

positioning said long axis of said energy beam on said mask blank to a second angular position and providing relative motion movement between said mask blank and said energy beam to form a second portion of said at least one feature; and patterning the semiconductor wafer with said mask.

21. The method according to claim 20, further comprising:

depositing a resist layer on the semiconductor wafer, wherein the mask is used to pattern the resist layer.

22. The method according to claim 20, wherein the semiconductor device fabricated comprises a magnetic random access memory (MRAM) or dynamic random access memory (DRAM) device.

* * * * *

UNITED STATES PATENT AND TRADEMARK OFFICE
CERTIFICATE OF CORRECTION

PATENT NO. : 6,767,674 B2  
DATED : July 27, 2004  
INVENTOR(S) : Carpi

Page 1 of 1

It is certified that error appears in the above-identified patent and that said Letters Patent is hereby corrected as shown below:

Column 1,  
Line 8, delete "Ag".

Column 8,  
Line 9, delete "enemy" and insert -- energy --.  
Line 44, between "shaped" and "using" insert -- edges comprises --

Signed and Sealed this

Thirtieth Day of November, 2004

JON W. DUDAS  
*Director of the United States Patent and Trademark Office*